United States Patent
Carpenter et al.

(10) Patent No.: US 9,603,286 B2
(45) Date of Patent: Mar. 21, 2017

(54) HEAT SINK ATTACHMENT APPARATUS AND METHOD

(71) Applicant: THOMAS LICENSING, Issy de Moulineaux (FR)

(72) Inventors: Joseph Lee Carpenter, Indianapolis, IN (US); Sin Hui Cheah, Carmel, IN (US); Christopher Michael William Proctor, Westfield, IN (US)

(73) Assignee: THOMSON LICENSING, Issy les Moulineaux (FR)

( * ) Notice: Subject to any disclaimer, the term of this patent is extended or adjusted under 35 U.S.C. 154(b) by 0 days.

(21) Appl. No.: 14/435,049

(22) PCT Filed: Oct. 17, 2013

(86) PCT No.: PCT/US2013/065529
§ 371 (c)(1),
(2) Date: Apr. 10, 2015

(87) PCT Pub. No.: WO2014/062974
PCT Pub. Date: Apr. 24, 2014

(65) Prior Publication Data
US 2015/0282388 A1    Oct. 1, 2015

Related U.S. Application Data

(60) Provisional application No. 61/715,876, filed on Oct. 19, 2012.

(51) Int. Cl.
*H05K 7/20*    (2006.01)
*H05K 7/12*    (2006.01)
(Continued)

(52) U.S. Cl.
CPC ..... *H05K 7/20409* (2013.01); *H01L 23/4093* (2013.01); *H05K 7/12* (2013.01);
(Continued)

(58) Field of Classification Search
CPC ........ H05K 7/20; H05K 7/20418; G06F 1/20; H01L 23/31; H01L 23/34; H01L 23/4093; H01L 23/473; F28F 9/26
(Continued)

(56) References Cited

U.S. PATENT DOCUMENTS 5,304,735 A * 4/1994 Earl .......................... B25B 7/02
                                              174/16.3
5,411,199 A    5/1995 Suppelsa et al.
(Continued)

FOREIGN PATENT DOCUMENTS

CN    2342343    10/1999
CN    1316876    10/2001
(Continued)

*Primary Examiner* — Robert J Hoffberg
(74) *Attorney, Agent, or Firm* — Brian J. Dorini; Jerome G. Schaefer

(57) ABSTRACT

There is provided an electronic device. The electronic device includes a circuit board having heat generating components thereon. The electronic device further includes spring clips or bend tabs. The electronic device also includes a heat sink, disposed over the circuit board, through which heat from the circuit board and the components thereon is released. The heat sink has a generally flat horizontal base and a series of vertically directed fins. The heat sink is secured to at least one of the circuit board and at least one of the components thereon by the spring clips or bend tabs being positioned at a periphery of the horizontal base. The spring clips or bend tabs have distal contact prongs that contact and apply downward force on the horizontal base.

16 Claims, 7 Drawing Sheets

(51) Int. Cl.
*H05K 9/00* (2006.01)
*H01L 23/40* (2006.01)
*H01L 23/367* (2006.01)

(52) U.S. Cl.
CPC ............. *H05K 7/2049* (2013.01); *H05K 9/00* (2013.01); *H05K 9/0022* (2013.01); *H01L 23/3672* (2013.01); *H01L 2924/0002* (2013.01); *Y10T 29/49227* (2015.01)

(58) Field of Classification Search
USPC ...... 361/679.46, 679.53, 690–694, 700–712, 361/715, 719, 720–724, 816, 818; 165/80.2, 80.3, 104.33, 185; 29/592.1; 257/706–727; 174/15.1, 16.3, 252, 254; 24/458, 459
See application file for complete search history.

(56) References Cited

U.S. PATENT DOCUMENTS

| | | | | |
|---|---|---|---|---|
| 5,436,798 | A * | 7/1995 | Wieland, Jr. | H01L 23/4093 165/185 |
| 5,541,811 | A * | 7/1996 | Henningsson | H01L 23/4093 165/185 |
| 5,570,271 | A * | 10/1996 | Lavochkin | H01L 23/4093 165/185 |
| 5,576,933 | A | 11/1996 | Campanella et al. | |
| 5,621,244 | A * | 4/1997 | Lin | H01L 23/4093 257/713 |
| 5,881,800 | A * | 3/1999 | Chung | H01L 23/4093 165/185 |
| 6,431,259 | B2 | 8/2002 | Hellbrueck et al. | |
| 6,617,685 | B1 * | 9/2003 | Bollesen | H01L 23/4093 257/706 |
| 6,856,511 | B1 * | 2/2005 | Viernes | H01L 23/4093 174/16.3 |
| 7,061,774 | B2 | 6/2006 | Zhang | |
| 7,355,857 | B2 * | 4/2008 | Pirillis | H05K 7/20418 165/80.3 |
| 7,567,439 | B2 | 7/2009 | Li et al. | |
| 7,804,696 | B2 * | 9/2010 | Kim | H05K 9/0058 361/816 |
| 7,983,048 | B2 * | 7/2011 | Sasaki | H01L 23/3677 165/104.33 |
| 8,164,922 | B2 * | 4/2012 | Kim | H05K 9/0058 361/696 |
| 9,146,062 | B2 * | 9/2015 | Too | F28F 9/26 |
| 2006/0181858 | A1 * | 8/2006 | Kamemoto | H01L 23/433 361/719 |
| 2007/0086170 | A1 | 4/2007 | Liang | |
| 2011/0255247 | A1 * | 10/2011 | Chu | H01L 23/4093 361/709 |
| 2011/0299288 | A1 | 12/2011 | Rapisarda | |
| 2014/0036451 | A1 * | 2/2014 | Simon | H01L 23/4093 361/720 |

FOREIGN PATENT DOCUMENTS

| | | |
|---|---|---|
| CN | 101754639 | 6/2010 |
| GB | 2295927 | 6/1996 |

* cited by examiner

HEAT SINK ATTACHMENT APPARATUS AND METHOD

CROSS-REFERENCE TO RELATED APPLICATIONS

This application claims the benefit, under 35 U.S.C. §365 of International Application PCT/US2013/065529, filed Oct. 17, 2013 which was published in accordance with PCT Article 21(2) on Apr. 24, 2014 in English and which claims the benefit of U.S. provisional patent application No. 61/715,876, filed Oct. 19, 2012.

TECHNICAL FIELD

The present principles relate generally to electronic devices and, more particularly, to a heat sink attachment apparatus and method for an electronic device.

BACKGROUND

Consumer/market preference for set top boxes and the like (such as computers, game consoles, DVD players, CD player, etc.) is to have such devices be small/compact.

Also, there is a need in set top boxes and the like to have long term performance capabilities and a need for product versatility/high functionality. This product versatility/high functionality requirement implies that numerous components such as hard drives, smart cards, printed circuit boards, light sources for panel buttons and light pipes, panel jacks, fans/blowers, heat sinks, etc., need to be in the device. Long term performance generally implies that heat generated in such devices be effectively managed or dissipated to keep the device at safe operating temperatures.

With the small size preference and high functionality and low cost requirements, set top boxes and the like must be density packed with internal components, which causes space to be at a premium and makes heat generation a significant problem.

One known quiet solution to dissipating heat is the use of heat sinks as opposed to fans. However, heat sinks tend to rattle and not make good contact useless they are held down by additional parts that take up more space on printed circuit boards. The additional parts also tend to increase costs.

As such, a need exists for an effective, low cost, quiet heat management system in electronic devices.

SUMMARY

These and other drawbacks and disadvantages of the prior art are addressed by the present principles, which are directed to a heat sink attachment apparatus and method for an electronic device.

According to an aspect of the present principles, there is provided an electronic device. The electronic device includes a circuit board having heat generating components thereon. The electronic device further includes spring clips or bend tabs. The electronic device also includes a heat sink, disposed over the circuit board, through which heat from the circuit board and the components thereon is released or dissipated. The heat sink has a generally flat horizontal base and a series of vertically directed fins. The heat sink is secured to at least one of the circuit board and at least one of the components thereon by the spring clips or bend tabs being positioned at a periphery of the horizontal base. The spring clips or bend tabs have distal contact prongs that contact and apply downward force on the horizontal base.

According to another aspect of the present principles, there is provided an electronic device. The electronic device includes a cover, side walls perpendicular to the cover, a bottom frame parallel to the cover, and a circuit board having heat generating components thereon. The electronic device further includes spring clips or bend tabs. The electronic device also includes a heat sink, disposed over the circuit board, through which heat from the circuit board and the components thereon is released or dissipated. The heat sink has a generally flat horizontal base and a series of vertically directed fins. The heat sink is secured to at least one of the circuit board and at least one of the components thereon by the spring clips or bend tabs which are positioned at a periphery of the horizontal base. The spring clips or bend tabs have distal contact prongs that contact and apply downward force on the horizontal base. The electronic device can further comprise a shield attached to at least one of a bottom surface of the circuit board and a bottom frame of the electronic device in which the shield can be attached to the spring clips or bend tabs. The shield can be substantially permanently attached to at least one of the bottom surface of the circuit board and the bottom frame of the electronic device or the shield can be removably attached to at least one of the bottom surface of the circuit board and the bottom frame of the electronic device. Additionally, the shield can comprise wrap-around bend tabs for attaching the shield to at least one of the bottom surface of the circuit board and the bottom frame of the electronic device. The heat sink can comprise a series of grooves inter-dispersed between the series of fins on a top side of the horizontal base, and the distal contact prongs can contact and apply downward force onto one or more of the grooves. Alternatively, the electronic device can include the shield being attached to at least one of a bottom surface of the circuit board and a bottom frame of the electronic device in which the bend tabs are attached to the circuit board and located outside a periphery of the shield.

According to yet another aspect of the present principles, there is provided a method. The method includes providing a single piece of sheet metal, and forming vertical sidewalls on the sheet metal to surround a periphery of a horizontal circuit board. The method further includes providing tabs that protrude upward from the vertical sidewalls or upward from the circuit board adjacent the vertical sidewalls, and positioning the formed sheet metal so that the vertical sidewalls surround the periphery of the circuit board. The method also includes attaching the formed sheet metal to the circuit board or a frame component under the circuit board, and placing a heat sink over the circuit board. The heat sink is for extracting heat from the circuit board and components thereon. The method additionally includes bending, twisting, rotating or distorting the tabs to contact an upper surface of the heat sink, thereby applying a downward force on the heat sink to cause the heat sink to contact at least one of the circuit board and the components thereon.

These and other aspects, features and advantages of the present principles will become apparent from the following detailed description of exemplary embodiments, which is to be read in connection with the accompanying drawings.

BRIEF DESCRIPTION OF THE DRAWINGS

The present principles may be better understood in accordance with the following exemplary figures, in which.

DETAILED DESCRIPTION

The present principles are directed to a heat sink attachment apparatus and method for an electronic device.

The present principles are applicable to any electronic device including, but not limited to, a set top box, computer, game console, DVD player, CD player or the like, where the electronic device is provided with an improved heat dissipation system. More specifically, a heat sink is provided over a heat generating component or a circuit board having heat generating components thereon, in which spring clip or bend tab assemblies are provided that may be individual pieces or a part of a shield that prevent the heat sink from coming loosing or rattling. Further, the spring clip or bend tab assemblies enhance the thermal contact between the heat sink and thermal contact pads or heat generating components which can be on a circuit board.

The present description illustrates the present principles. It will thus be appreciated that those skilled in the art will be able to devise various arrangements that, although not explicitly described or shown herein, embody the present principles and are included within its spirit and scope.

All examples and conditional language recited herein are intended for pedagogical purposes to aid the reader in understanding the present principles and the concepts contributed by the inventors to furthering the art, and are to be construed as being without limitation to such specifically recited examples and conditions.

Moreover, all statements herein reciting principles, aspects, and embodiments of the present principles, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

Figure 1:
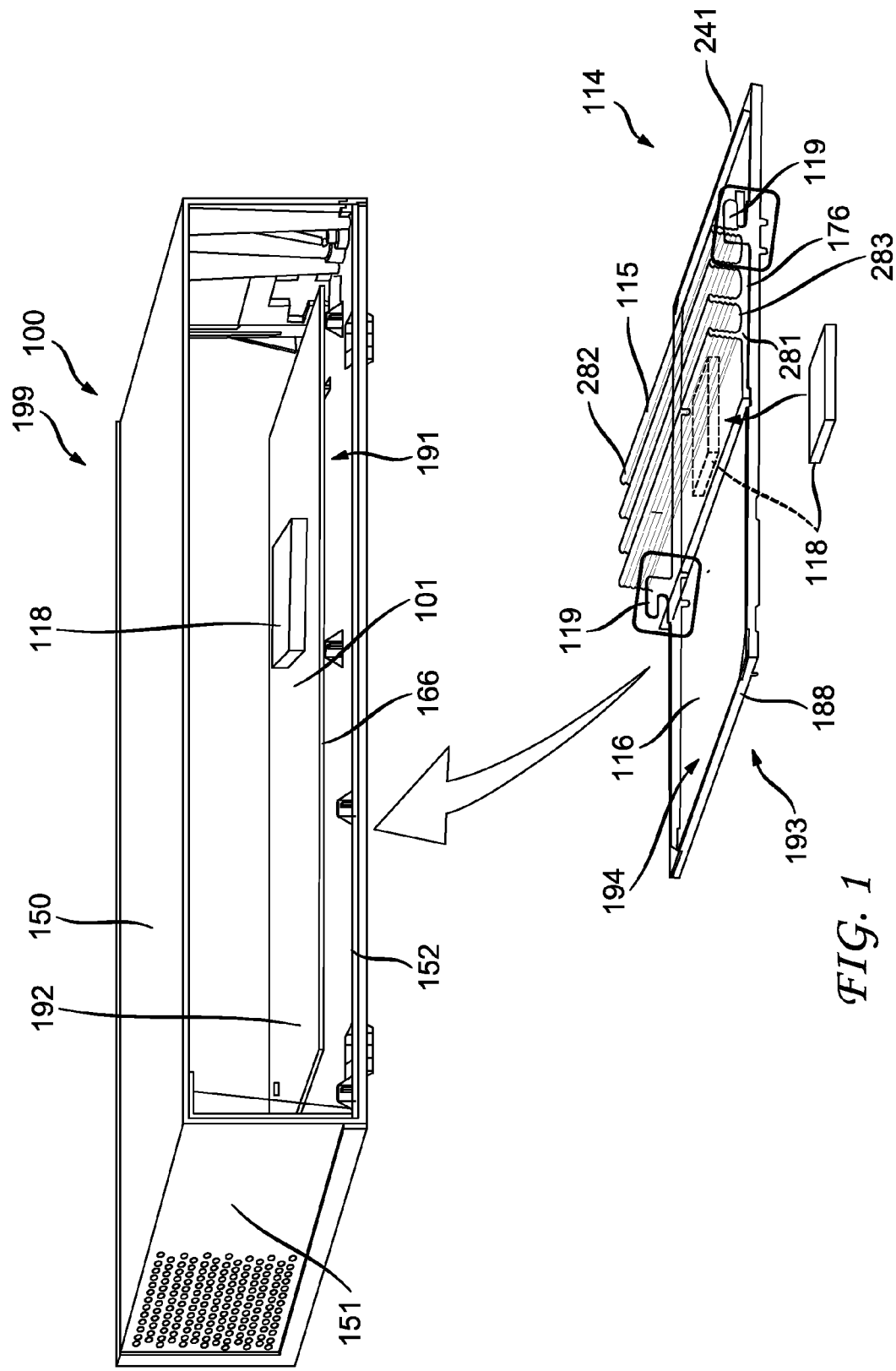
FIG. 1 shows a perspective view 199 of an electronic device 100 with some elements thereof shown outside of the electronic device 100, in accordance with an embodiment of the present principles.

FIG. 1 shows a perspective view 199 of an electronic device 100 with some elements thereof shown outside of the electronic device 100, in accordance with an embodiment of the present principles. The electronic device 100 can be, for example, but is not limited to, a set top box, a hard drive, a DVD player, and so forth. These and other embodiments of an electronic device to which the present principles can be applied are readily determined by one of ordinary skill in the art, given the teachings of the present principles provided herein, while maintaining the spirit of the present principles.

The electronic device 100 includes a cover 150, side walls 151, a bottom frame 152, a printed circuit board (PCB) 101 with heat generating components thereon, a heat sink 115, a heat sink attachment apparatus (also interchangeably referred to here as "spring clip or bend tab assembly") 114, and an element 118 which can be a thermal pad and/or an integrated circuit chip 118. In the case of a thermal pad, the thermal pad 118 can be on the PCB 101 and/or on the bottom surface 195 of the heat sink 115. The thermal pad 118 can be attached to the PCB 101 or to the bottom surface 195 of the heat sink 115, to facilitate heat extraction. In the case of an integrated circuit chip, the heat sink 115 or a contact pad (not shown) under the heat sink 115 can contact the chip 118 on the PCB 101. Moreover, in the case of both, the integrated circuit chip can be on the PCB 101 and the thermal pad can be on the integrated circuit chip, where the heat sink 115 is then placed on the thermal pad. These and other configurations are readily determined by one of ordinary skill in the art, given the teachings of the present principles provided herein, while maintaining the spirit of the present principles.

The PCB 101 has a bottom surface 191 and a top surface 192. The heat sink has a bottom surface 195 and a top surface 196 (see FIG. 4).

As shown in FIG. 1, the side walls 151 are perpendicular to the cover 150. The bottom frame 152 is parallel to the cover 150. A front panel of the electronic device 100 is removed to show the PCB 101.

The heat sink 115 can have a generally flat horizontal base 281 and a series of vertically directed fins or columns (hereinafter "fins") 282. Each of the fins 282 can extend substantially from edge to opposing edge of the PCB 101. The fins 282 can have a series of grooves 283 which can assist in maximizing surface area, thereby increasing emissivity. In a particular embodiment, the heat sink 115 can cover less than 50% of the top view surface area of the PCB 101. In another embodiment, the heat sink 115 can cover less than 25% of the top view surface area of the PCB 101. Of course, other percentages can also be used in accordance with the teachings of the present principles, while maintaining the spirit of the present principles.

The spring clip or bend tab assembly 114 includes spring clips or bend tabs 119. The spring clip or bend tab assembly 114 can be, for example, bolted, soldered, clipped, riveted and/or screwed to the PCB 101 and/or the frame 152. The heat sink 115 is attached to the electronic device 100 (or element thereof) using the spring clips or bend tabs 119. The spring clips or bend tabs 119 can be individual pieces or a part of a shield 116 that has a bottom surface 193 and a top surface 194 and sidewalls 241 on a periphery 188 of the shield 116. The sidewalls 241 can substantially follow the periphery 166 of the PCB 101. The sidewalls 241 can be vertical and integrated with the spring clip or bend tabs 119. The spring clips or bend tabs 119 can be positioned at a periphery 176 of the flat horizontal base 281 of the heat sink 115. When engaged, the spring clips or bend tabs 119 hold the heat sink 115 in place and prevent the heat sink 115 from coming loose, thus providing a low cost way to secure the heat sink 115.

By including spring clips or bend tabs 119 in the shield 116, cost is lowered and space can be saved. The reason is that heat sink mounting holes on the PCB 101 worsen the trace layout utilization of compact and high density electrical design. For example, avoiding the use of a 3 mm mounting hole on a PCB can easily yield an extra 12 traces to be laid out in the PCB space vacated by the hole on a single layer. For multi-layer PCBs, the increase in trace runs is even greater.

It is to be appreciated that the various embodiments of the present principles described herein include advantages over plastic spring-loaded pins, between the top of the heat sink and the cover, used to hold down the heat sink. These pins require the heat sink to have "ears" on the base along with space on the board directly around the chip it is cooling. Space for holes around chips can sometimes be hard to find since the holes required for this type of attachment could cut through the routed traces. These and other advantages of the present principles are readily apparent to one of ordinary skill in the art, given the teachings of the present principles provided herein.

The present principles are applicable to systems which may need shielding (from, for example, radio frequency (RF) emissions) and heat sinking. The idea of merging the shield with the heat sink holders saves money and space. To make room for the spring clips or bend tabs 119, cuts can be made in the shield 116 or the spring clips or bend tabs 119 can be formed from a unitary single piece of metal along with the shield 116, or the spring clips or bend tabs 119 can be welded or snapped onto the shield walls 241. Thus, the spring clips or bend tabs 119 can be substantially permanently attached to the shield 116, e.g., by collectively being made from a unitary single piece of metal, being soldered together, being welded together, being riveted together, and so forth. Alternatively, the spring clips or bend tabs can be removably attached to the shield, e.g., using screws, bolts, clips, springs, and so forth.

While not explicitly shown, it is to be appreciated that other components such as, but not limited to, smart card sockets, lighting components, receiver components, hard drives, and so forth can be present in the electronic device 100.

Figure 2:
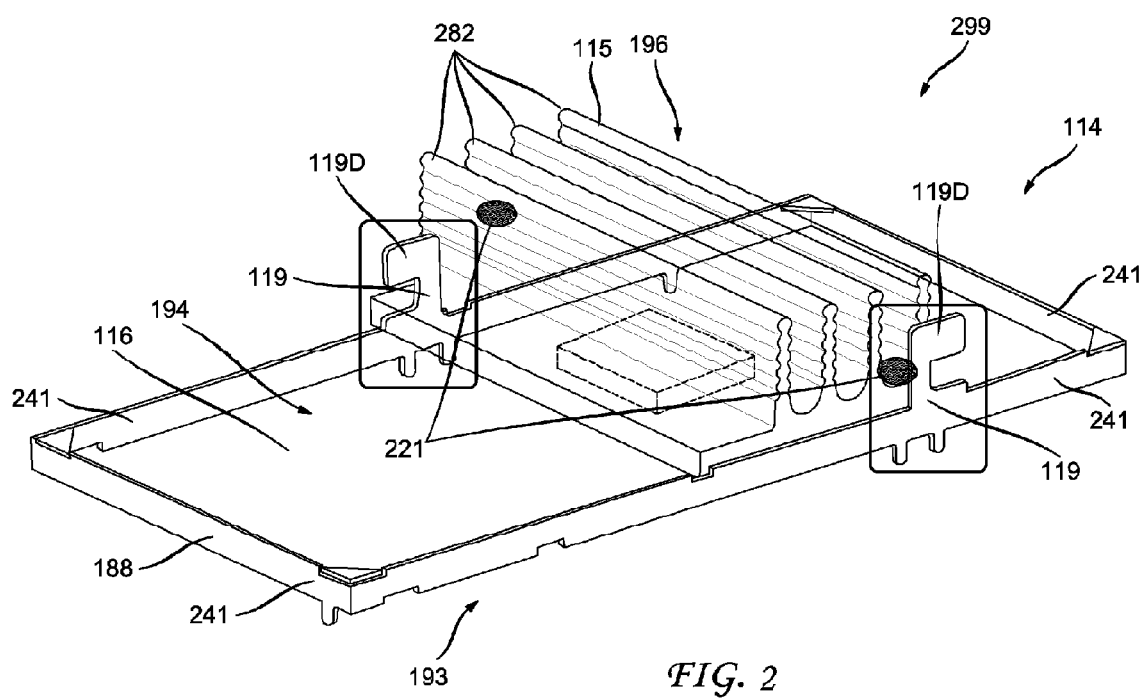
FIG. 2 shows a perspective see-through view 299 of the heat sink 115 and spring clip or bend tab assembly 114 with the spring clips or bend tabs 119 not engaged, in accordance with an embodiment of the present principles.

FIG. 2 shows a perspective see-through view 299 of the heat sink 115 and spring clip or bend tab assembly 114 with the spring clips or bend tabs 119 not engaged, in accordance with an embodiment of the present principles. Here, the spring clips or bend tabs 119 (shown encircled for the sake of clarity) are not engaged, but when the distal contact prongs 119D of the spring clips or bend tabs 119 are twisted or rotated or bent inward they will contact the heat sink 115 at contact points 221 and hold the heat sink 115 down. It is to be appreciated that the contact points 221 can be one or more of the grooves 283 and/or any portion of the top surface 196 of the heat sink 115.

Figure 3:
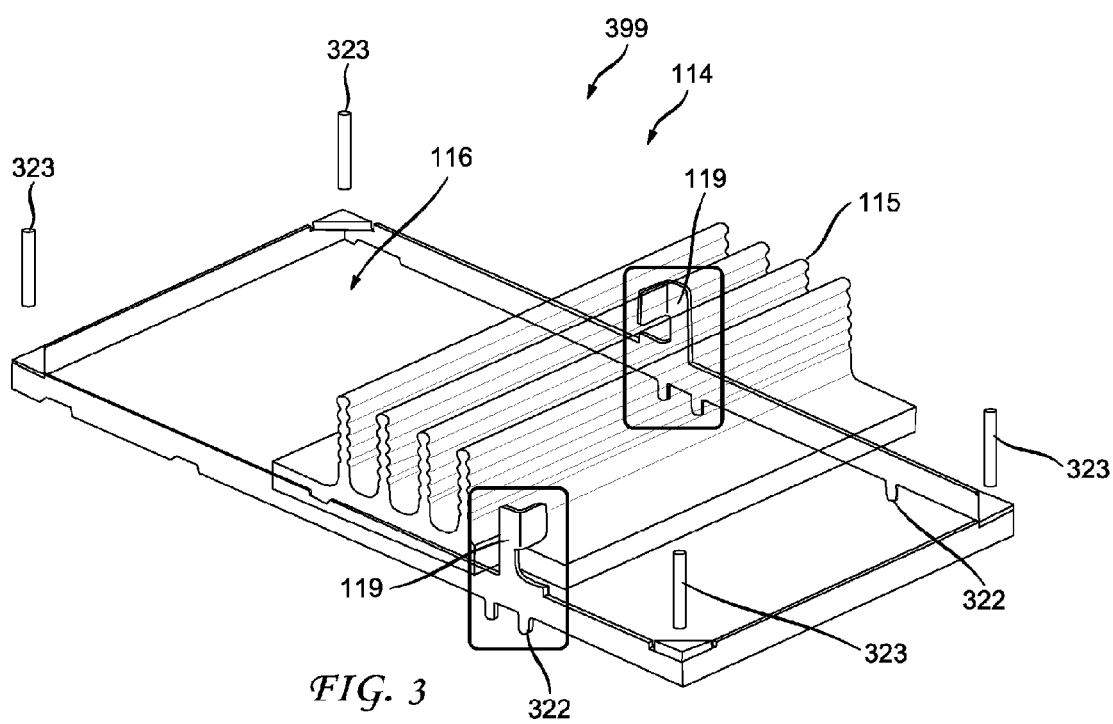
FIG. 3 shows another perspective see-through view 399 of the heat sink 115 and spring clip or bend tab assembly 114 with the spring clips or bend tabs 119 engaged, in accordance with an embodiment of the present principles.

FIG. 3 shows another perspective see-through view 399 of the heat sink 115 and spring clip or bend tab assembly 114 with the spring clips or bend tabs 119 engaged, in accordance with an embodiment of the present principles. The heat sink 115 is shown as being raised so that the spring clips or bend tabs 119 (shown encircled for the sake of clarity) can be clearly viewed. Here, the spring clips or bend tabs 119 are engaged by being bent (or twisted or rotated or distorted) to contact the heat sink 115. In particular, distal contact prongs 119D of the spring clips or bend tabs 119 are bent inward to contact the heat sink 115. In this manner, the distal contact prongs 119D trap the heat sink 115 in place and maintain a certain amount of pressure on the heat sink 115 and, e.g., a chip (or other element) there under. The distal contact prongs 119D of the spring clips or bend tabs 119 can be positioned between adjacent fins of the heat sink 115.

Shield tabs 322 can extend downward from the shield walls 241 and these tabs 322 can bend inward to wrap around components such as the bottom surface 195 (see FIG. 4) of the heat sink 115 or the bottom surface 191 of the PCB 101 or an interior frame within the electronic device 100. The shield tabs 322 can help secure the shield 116 to the electronic device 100. Alternatively and/or additionally, bolts, screws, and/or rivets 323 can be used to attached the shield 116 to the PCB 101 and/or a frame of the electronic device 100, e.g., through complementary holes in the shield 116.

Figure 4:
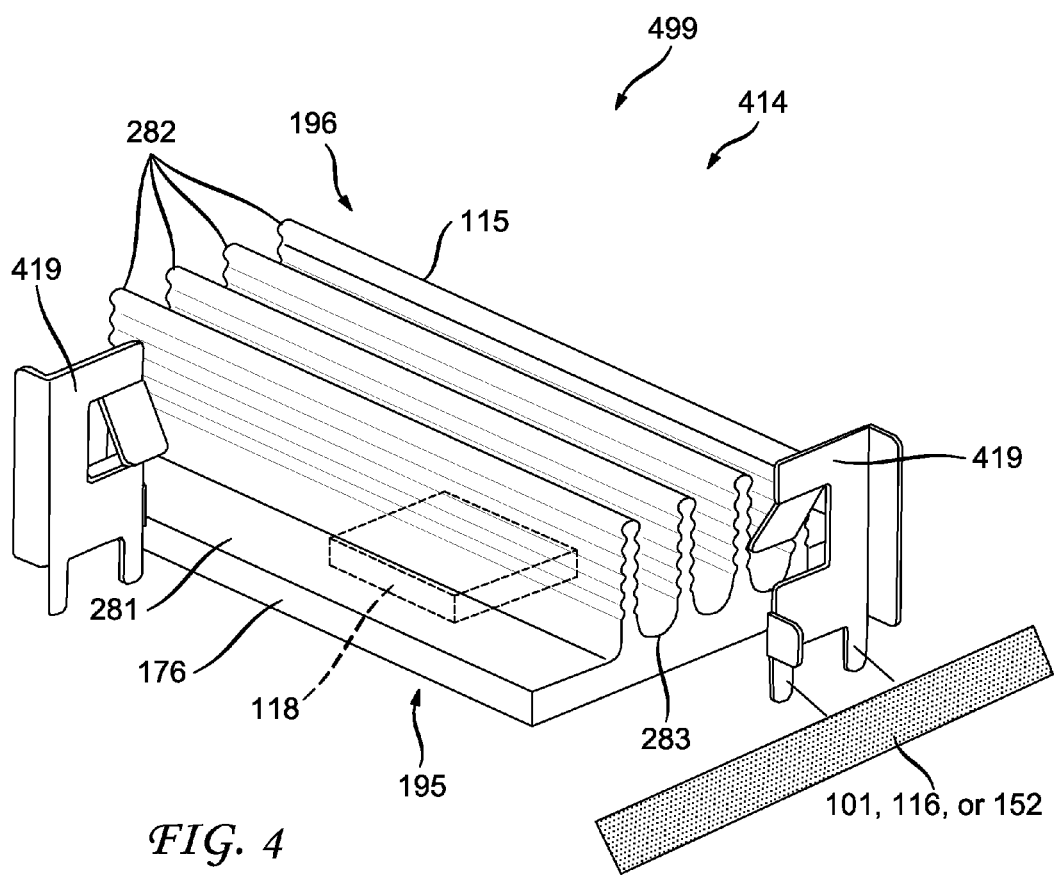
FIG. 4 shows a perspective view 499 of another spring clip or bend tab assembly 414, in accordance with an embodiment of the present principles.

FIG. 4 shows a perspective view 499 of another spring clip or bend tab assembly 414, in accordance with an embodiment of the present principles. The spring clip or bend tab assembly 414 clips the heat sink down by using paperclip-like spring clips or bend tabs 419. The spring clips or bend tabs 419 can be bent inward and directed downward to contact and hold the heat sink 115 in place. The spring clips or bend tabs 419 can be separate from the shield 116 and can be welded or soldered to the shield 416 or PCB 101 or frame (e.g., bottom frame 152). In FIG. 4, the heat sink 115 is located on a thermal contact pad 118 that is located on the top surface 192 of the PCB 101 (not shown in FIG. 4) and/or on the bottom surface 195 of the heat sink 115. The spring clips or bend tabs 419 can be located on the outside of the shield 116, and the heat sink 115 can snap in from the top.

Figure 5:
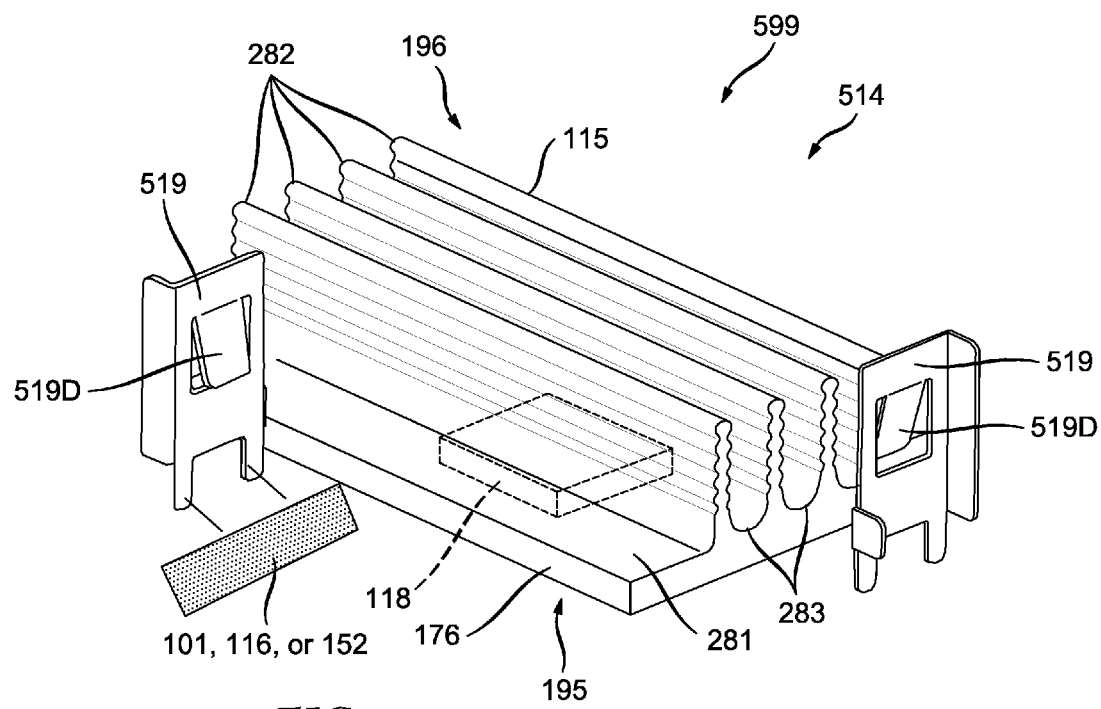
FIG. 5 shows a perspective view 599 of another spring clip or bend tab assembly 514, in accordance with an embodiment of the present principles.
Figure 6:
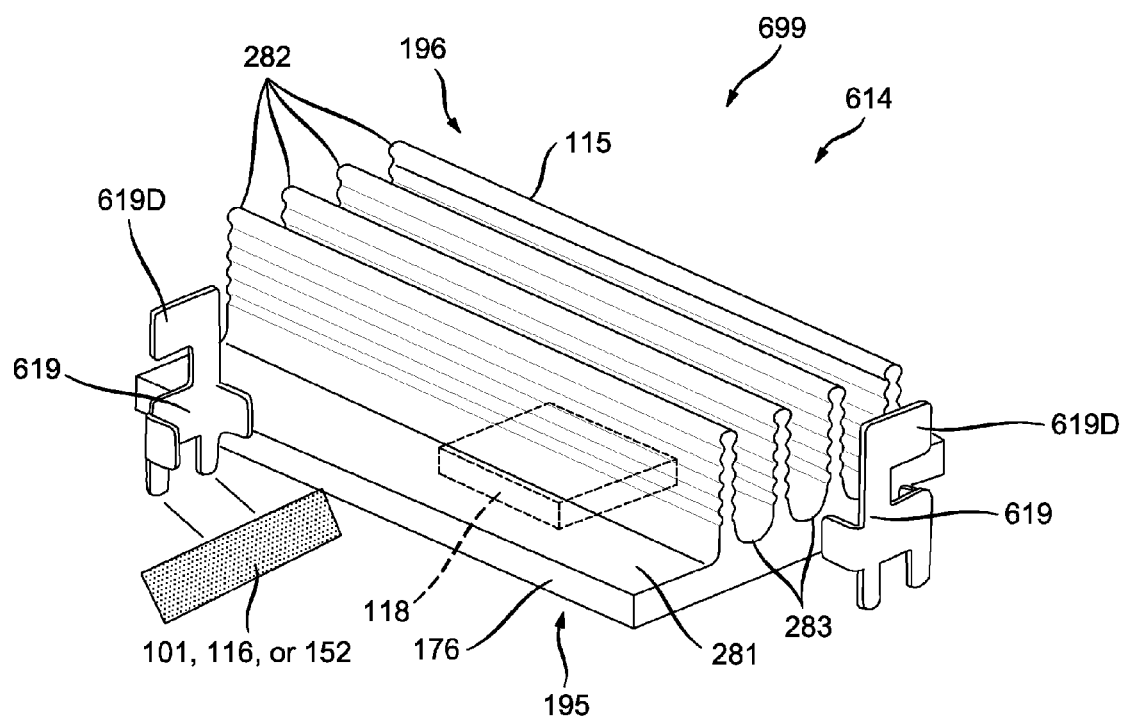
FIG. 6 shows a perspective view 699 of another spring clip or bend tab assembly 614, in accordance with an embodiment of the present principles.

FIG. 5 shows a perspective view 599 of another spring clip or bend tab assembly 514, in accordance with an embodiment of the present principles, and FIG. 6 shows another perspective view 699 of yet another spring clip or bend tab assembly 614, in accordance with an embodiment of the present principles. The spring clip or bend tab assembly 514 includes spring clips or bend tabs 519. The spring clip or bend tab assembly 614 includes spring clips or bend tabs 619. The spring clips or bend tabs 519 each include a respective prong 519D that is attached from three sides and bends from a top portion of the spring clips or bend tabs 519 towards the heat sink 115 to engage the contact points 221 on the heat sink 115. The spring clips or bend tabs 619 each include a respective prong that attached from one side and bends from the corresponding side of the spring clips or bend tabs 619 towards the heat sink 115 to engage the contact points 221 on the heat sink 115. The spring clip or bend tab assembly 514 and/or the spring clip or bend tab assembly 614 can be separate from the shield 516 and they can also be welded or soldered to the shield 116 or PCB 101 or frame (e.g., bottom frame 152) to hold the heat sink 115 down.

In one or more embodiments, a portion of the spring clips or bend tabs can contact the heat sink 115 on an upper surface in between the fins or rails 282 and/or on a surface outside of the fins or rails 282.

Figure 7:
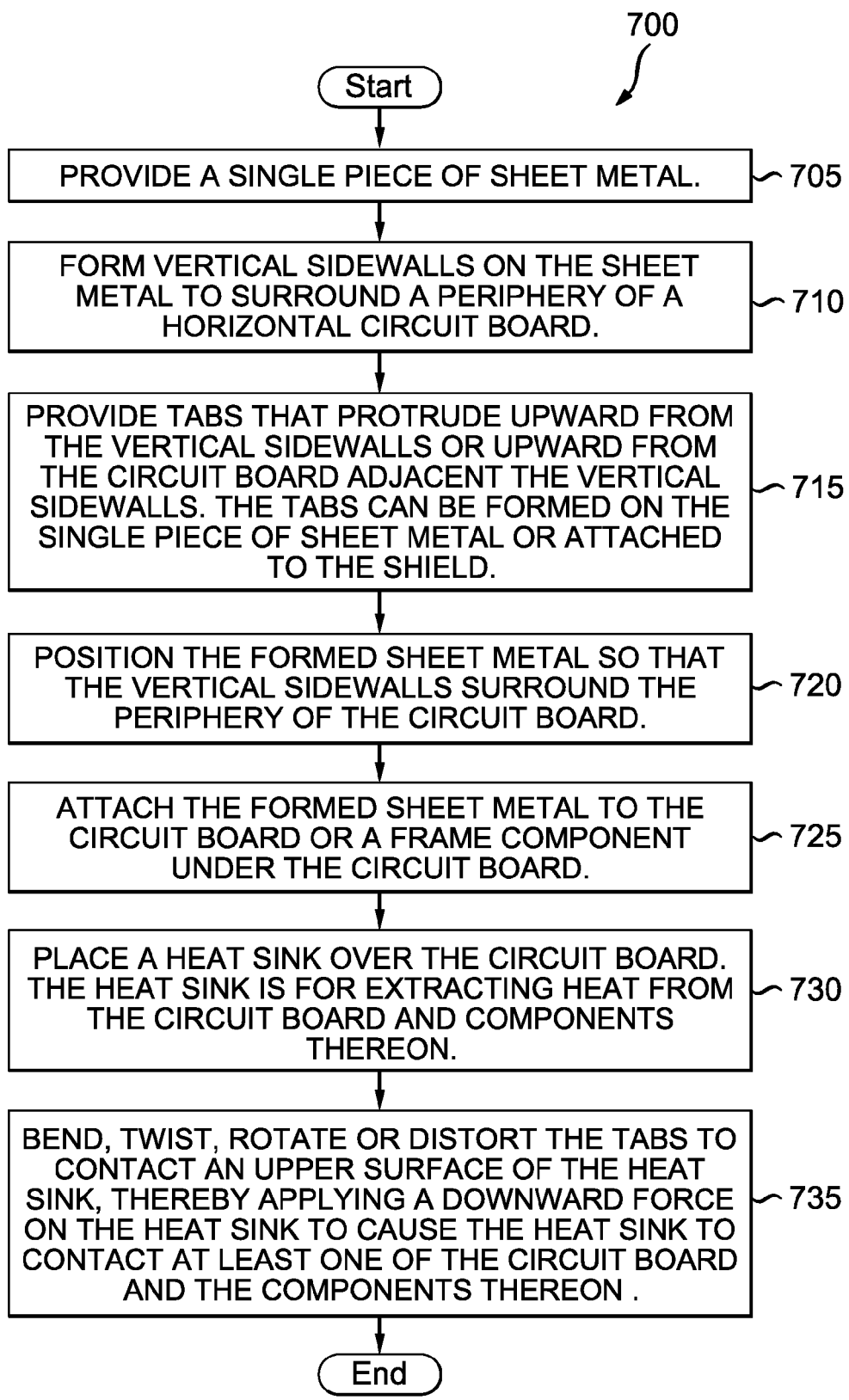
FIG. 7 shows a flowchart for a method 700 for providing a heat sink attachment apparatus, in accordance with an embodiment of the present principles.

FIG. 7 shows a flowchart for a method 700 for providing a heat sink attachment apparatus, in accordance with an embodiment of the present principles. At step 705, provide a single piece of sheet metal. At step 710, form vertical sidewalls on the sheet metal to surround a periphery of a horizontal circuit board. At step 715, provide tabs that protrude upward from the vertical sidewalls or upward from the circuit board adjacent the vertical sidewalls. Step 715 can involve forming the tabs on the single piece of sheet metal or attaching the tabs to the shield. At step 720, position the formed sheet metal so that the vertical sidewalls surround the periphery of the circuit board. At step 725, attach the formed sheet metal to the circuit board or a frame component under the circuit board. At step 730, place a heat sink over the circuit board, the heat sink for extracting heat from the circuit board and components thereon. At step 735, bend, twist, rotate or distort the tabs to contact an upper surface of the heat sink, thereby applying a downward force on the heat sink to cause the heat sink to contact at least one of the circuit board and the components thereon.

These and other features and advantages of the present principles may be readily ascertained by one of ordinary skill in the pertinent art based on the teachings herein. Given the teachings herein, one of ordinary skill in the pertinent art will be able to contemplate these and similar implementations or configurations of the present principles.

Although the illustrative embodiments have been described herein with reference to the accompanying drawings, it is to be understood that the present principles is not limited to those precise embodiments, and that various changes and modifications may be effected therein by one of ordinary skill in the pertinent art without departing from the scope or spirit of the present principles. All such changes and modifications are intended to be included within the scope of the present principles as set forth in the appended claims.

The invention claimed is:

1. An electronic device, comprising:
   a circuit board having heat generating components thereon;
   spring clips; and
   a heat sink, disposed over the circuit board, through which heat from the circuit board and the components thereon is released or dissipated, and having a generally flat horizontal base and a series of vertically directed fins; and
   a shield attached to at least one of a bottom surface of the circuit board or a bottom frame of the electronic device, the shield being further attached to the spring clips;
   wherein the heat sink is secured to at least one of the circuit board or one or more of the components thereon by the spring clips being positioned at a periphery of the horizontal base, the spring clips having distal contact prongs that contact and apply downward force on the horizontal base.

2. The electronic device of claim 1, wherein the shield is substantially permanently attached to the at least one of the bottom surface of the circuit board or the bottom frame of the electronic device.

3. The electronic device of claim 1, wherein the shield is removably attached to the at least one of the bottom surface of the circuit board or the bottom frame of the electronic device.

4. The electronic device of claim 1, wherein the shield comprises wrap-around bend tabs for attaching the shield to the at least one of the bottom surface of the circuit board or the bottom frame of the electronic device.

5. The electronic device of claim 1, wherein the shield has sidewalls surrounding a periphery of the circuit board.

6. The electronic device of claim 1, wherein the spring clips are removably attached to the shield.

7. The electronic device of claim 1, wherein the heat sink comprises a series of grooves inter-dispersed between the series of fins on a top side of the horizontal base, and the distal contact prongs contact and apply downward force onto one or more of the grooves.

8. An electronic device, comprising:
   a cover;
   side walls perpendicular to the cover;
   a bottom frame parallel to the cover;
   a circuit board having heat generating components thereon, the circuit board mounted in a housing comprising the bottom frame, the side walls, and the cover;
   bend tabs;
   a shield attached to at least one of a bottom surface of the circuit board and a bottom frame of the electronic device, the shield being further attached to the bend tabs; and
   a heat sink, disposed over the circuit board, through which heat from the circuit board and the components thereon is released, and having a generally flat horizontal base and a series of vertically directed fins;
   wherein the heat sink is secured to at least one of the circuit board or one or more of the components thereon by the bend tabs being positioned on the horizontal base, the bend tabs having distal contact prongs that contact and apply downward force on the horizontal base.

9. The electronic device of claim 8, wherein the shield is substantially permanently attached to the at least one of the bottom surface of the circuit board or the bottom frame of the electronic device.

10. The electronic device of claim 8, wherein the shield is removably attached to the at least one of the bottom surface of the circuit board or the bottom frame of the electronic device.

11. The electronic device of claim 8, wherein the shield comprises wrap-around bend tabs for attaching the shield to the at least one of the bottom surface of the circuit board or the bottom frame of the electronic device.

12. The electronic device of claim 8, wherein the bend tabs are substantially permanently attached to the shield.

13. The electronic device of claim 8, wherein the heat sink comprises a series of grooves inter-dispersed between the series of fins on a top side of the horizontal base, and the distal contact prongs contact and apply downward force onto one or more of the grooves.

14. A method, comprising:
   providing a single piece of sheet metal;
   forming vertical sidewalls on the sheet metal to surround a periphery of a horizontal circuit board;
   providing tabs that protrude upward from the vertical sidewalls;
   positioning the formed sheet metal so that the vertical sidewalls surround the periphery of the circuit board;
   attaching the formed sheet metal to the circuit board or a frame component under the circuit board;
   placing a heat sink over the circuit board, the heat sink for extracting heat from the circuit board and components thereon; and
   bending, twisting, rotating or distorting the tabs to contact an upper surface of the heat sink, thereby applying a downward force on the heat sink to cause the heat sink to contact at least one of the circuit board or one or more of the components thereon.

15. The method of claim 14, wherein said step of providing tabs that protrude upward from the vertical sidewalls comprises forming the tabs on the single piece of sheet metal.

16. The method of claim 14, wherein said step of providing tabs that protrude upward from the vertical sidewalls comprises attaching the tabs to the vertical sidewalls.

\* \* \* \* \*